(12) United States Patent
Hara et al.

(10) Patent No.: US 6,919,596 B2
(45) Date of Patent: Jul. 19, 2005

(54) STRUCTURE OF A CAPACITIVE ELEMENT OF A BOOSTER CIRCUIT INCLUDED IN A SEMICONDUCTOR DEVICE AND METHOD OF MANUFACTURING SUCH A STRUCTURE

(75) Inventors: Hideki Hara, Tokyo (JP); Kazuhiko Sanada, Tokyo (JP)

(73) Assignee: NEC Electronics Corporation (JP)

(*) Notice: Subject to any disclaimer, the term of this patent is extended or adjusted under 35 U.S.C. 154(b) by 0 days.

(21) Appl. No.: 10/267,246

(22) Filed: Oct. 9, 2002

(65) Prior Publication Data

US 2003/0071297 A1 Apr. 17, 2003

(30) Foreign Application Priority Data

Oct. 11, 2001 (JP) ........................................ 2001-313962

(51) Int. Cl.[7] ............................................. H01L 27/108
(52) U.S. Cl. ....................................... 257/299; 257/315
(58) Field of Search ................................ 257/298, 299, 257/314–316

(56) References Cited

U.S. PATENT DOCUMENTS

| | | | |
|---|---|---|---|
| 5,449,636 A | | 9/1995 | Park et al. ..................... 437/52 |
| 6,015,984 A | * | 1/2000 | Leu ............................. 257/298 |
| 6,423,997 B1 | * | 7/2002 | Takahashi ..................... 257/298 |

FOREIGN PATENT DOCUMENTS

| | | | |
|---|---|---|---|
| JP | 5-218298 | 8/1993 | ........... H01L/27/04 |
| JP | 7-22195 | 3/1995 | ......... H01L/27/115 |
| JP | 7-78889 | 3/1995 | ....... H01L/21/8242 |
| JP | 2000-49299 | 2/2000 | ........... H01L/27/10 |
| JP | 2000-188375 | 7/2000 | ........... H01L/27/04 |
| JP | 2000-349259 | 12/2000 | ......... H01L/27/108 |

* cited by examiner

Primary Examiner—Jack Chen
(74) Attorney, Agent, or Firm—Hayes Soloway P.C.

(57) ABSTRACT

A lower electrode in a capacitive element area is formed on a field oxide film in self-alignment with trenches, so that the lower electrode and floating gate electrodes in a memory cell area can simultaneously be formed in one process. The lower electrode is surrounded by the trenches defined in the field oxide film. An upper electrode formed together with a control gate electrode in one process is disposed over the lower electrode with an insulating film, which is formed together with an intergate insulating film in the memory cell area in one process, interposed therebetween. With this arrangement, a semiconductor device having a capacitive element for use in a charge pump circuit or the like has its chip area prevented from being increased, allow the capacitive element to have a highly accurate capacitance, and can be manufactured in a reduced number of fabrication steps.

6 Claims, 7 Drawing Sheets

STRUCTURE OF A CAPACITIVE ELEMENT OF A BOOSTER CIRCUIT INCLUDED IN A SEMICONDUCTOR DEVICE AND METHOD OF MANUFACTURING SUCH A STRUCTURE

BACKGROUND OF THE INVENTION

1. Field of the Invention

The present invention relates to a semiconductor device such as a flash memory, an EEPROM (Electrically Erasable Programmable Read Only Memory), or the like and a method of manufacturing such a semiconductor device, and more particularly to a structure of a capacitive element of a booster circuit included in a semiconductor device and a method of manufacturing such a structure.

2. Description of the Related Art

Nonvolatile semiconductor memory devices such as flash memories, EEPROMs, etc. which are generally known in the art have a cell structure comprising, on a semiconductor substrate, source and drain diffused regions, a floating gate electrode disposed on a channel region between the source and drain diffused regions with a gate insulating film interposed therebetween, and a control gate electrode disposed on the floating gate electrode with an insulating film interposed therebetween. The assignee of the present invention has proposed a process of manufacturing such a nonvolatile semiconductor memory by forming an element dividing trench in self-alignment with the floating gate electrode, as disclosed in Japanese patent Laid-open publication No. 7-22195 (JP, 7-022195, B). The disclosed process, which is also called an FSA process, is advantageous in that the floating gate electrode can be localized only on the channel region between the source and drain diffused regions and an area taken up by a memory cell can be minimized.

For writing and erasing data, the nonvolatile semiconductor memories such as flash memories and EEPROMs require positive and negative voltages which are greater than the power supply voltage that is supplied to the semiconductor memory device. The power supply voltage supplied from an external circuit to a nonvolatile semiconductor memory is normally 3 V, 3.3 V, or 5 V, whereas the nonvolatile semiconductor memory requires a greater voltage of −11 V and +12 V for erasing data and a greater voltage of −11 V or in the range from +5 to +9 V for writing data. It is general practice to generate these voltages so that they are greater than the power supply voltage within the semiconductor memory device by increasing the power supply voltage, which is supplied from an external circuit, with a charge pump circuit (i.e., booster circuit) included in the semiconductor memory device. The charge pump circuit comprises a capacitive element (i.e., capacitor), a switching element, and a diode in combination. The capacitive element typically has a capacitance of about 1500 pF. The capacitive element is fabricated in the nonvolatile semiconductor memory within an ordinary semiconductor device fabrication process. Japanese laid-open patent publication No. 2000-49499 (JP, P2000-049499A) discloses a charge pump circuit for simultaneously generating positive and negative potentials, which is applicable as a flash memory.

To the capacitive element of the charge pump circuit, there is applied a voltage which is much higher than the voltage that can normally be applied between the floating gate electrode and the channel region and which is higher than the power supply voltage supplied to the nonvolatile semiconductor memory device. Therefore, this capacitive element needs to have a lower electrode on a relatively thick insulating film and an upper electrode thereon with an insulating film as a capacitive layer being interposed therebetween. If a nonvolatile semiconductor memory is to be produced according to the FSA process disclosed in JP7-022195B, since a lower electrode of a capacitive element cannot be formed on a thin gate oxide film, it is necessary to form the lower electrode on a trench-embedded insulating film, thus providing a capacitive element for a charge pump circuit.

Figure 1A:
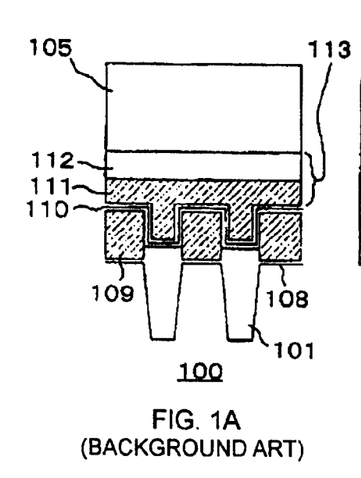
FIGS. 1A and 1B are cross-sectional views of a conventional nonvolatile semiconductor memory.
Figure 1B:
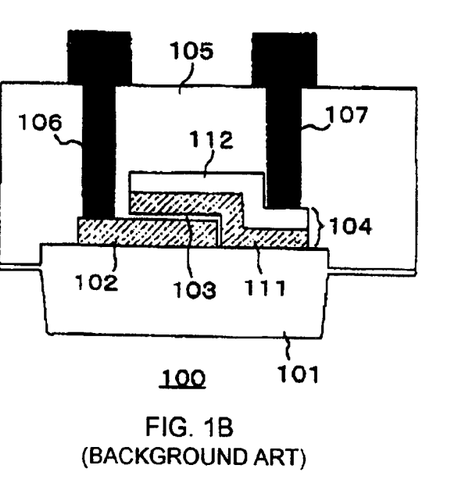

FIGS. 1A and 1B show in cross section the arrangement of a nonvolatile semiconductor memory device incorporating a capacitive element. FIG. 1A shows a memory cell area and FIG. 1B shows an area where a capacitive element of a charge pump circuit is formed. Specifically, FIG. 1A shows a cross section along a plane including a channel region of the memory cell area, the plane being perpendicular to a straight line interconnecting a source region and a drain region.

Trench-embedded insulators 101 are formed in the surface of semiconductor substrate 100. In the capacitive element, lower electrode 102 made of polysilicon (polycrystalline silicon) is formed on trench-embedded insulators 101, and upper electrode 104 is formed over lower electrode 102, with insulating film 103 interposed therebetween. Interlayer insulating film 105 is disposed so as to cover lower electrode 102 and upper electrode 104. Interlayer insulating film 105 is connected to insulating film 103. Interconnection contacts 106, 107 extend through interlayer insulating film 105 are electrically connected to lower electrode 102 and upper electrode 104, respectively. Upper electrode 104 is of a double-layer structure including polysilicon layer 111 disposed closer to lower electrode 102 and silicide layer 112 disposed on polysilicon layer 111.

In the memory cell area, a plurality of floating gate electrodes 109 of polysilicon are disposed over a channel region between adjacent trench-embedded insulators 101 with gate insulating film 108 interposed therebetween. Control gate electrode 113 is formed over floating gate electrodes 109 with insulating film (i.e., intergate insulating film) 110 interposed therebetween. Control gate electrode 113 is fabricated in the same process as upper electrode 104 of the capacitive element area. Like upper electrode 104, control gate electrode 113 is of a double-layer structure including polysilicon layer 111 and silicide layer 112. Control gate electrode 113 is covered with interlayer insulating film 105.

In the case where the capacitive element of the charge pump circuit is to be formed on the trench-embedded insulating films for device isolation, lower electrode 102 of the capacitive element and the floating gate electrodes 109 of the memory cell cannot be fabricated in one process, and a separate photolithographic process is needed for forming the lower electrode. Specifically, after trenches are formed in self-alignment with floating gate electrodes 109 and insulators are embedded in the trenches for device isolation, the upper surface of trench-embedded insulators 101 is patterned to form lower electrode 102. The above process poses limitations on the layout in the nonvolatile semiconductor memory device.

Since the capacitance of the capacitive element for the charge pump circuit is relatively large, it is necessary to form excessively large trench regions for the purpose of device isolation, and it is also necessary to divide the lower electrode and position the divided regions separately in association with the respective trench regions for device isolation. If the large trench regions are formed, then the chip as the semiconductor memory device has a large area, and when the surface of the trench-embedded insulators is planarized by chemical mechanical polishing (CMP), dents tend to be formed substantially centrally in the trench-embedded insulators, adversely affecting the shape of the capacitive element formed thereon and making it difficult to produce a highly accurate capacitance.

SUMMARY OF THE INVENTION

It is an object of the present invention to provide a semiconductor device such as a nonvolatile semiconductor memory device having a capacitive element for use in a charge pump circuit, the semiconductor device having a chip area prevented from increasing, allowing the capacitive element to have a highly accurate capacitance, and being manufactured according to a fabrication process having a reduced number of steps.

Another object of the present invention is to provide a method of manufacturing a semiconductor device such as a nonvolatile semiconductor memory device having a capacitive element for use in a charge pump circuit, the semiconductor device having a chip area prevented from increasing, allowing the capacitive element to have a highly accurate capacitance, and being manufactured according to a fabrication process having a reduced number of steps.

The first object can be achieved by a semiconductor device comprising a semiconductor substrate, a device isolation film disposed on the semiconductor substrate, a lower electrode disposed on the device isolation film, a trench defined in the device isolation film in surrounding relation to the lower electrode and having a bottom lower than a bottom of the lower electrode; a trench-embedded insulator embedded in the trench, an insulating film disposed on the lower electrode, and an upper electrode disposed over the lower electrode with the insulating film interposed therebetween, wherein the lower electrode, the insulating film, and the upper electrode jointly make up a capacitive element.

The second object can be achieved by a method of manufacturing a semiconductor device, comprising the steps of selectively forming a lower electrode layer on a device isolation film disposed on a surface of a semiconductor substrate, defining a trench in the device isolation film in surrounding relation to the lower electrode layer in self-alignment with the lower electrode layer, embedding a trench-embedded insulator in the trench, forming an insulating film on the lower electrode layer, and forming an upper electrode layer on the insulating film.

The second object can also be achieved by a method of manufacturing a semiconductor device having a plurality of memory cells disposed on a semiconductor substrate, the semiconductor device including a memory cell area and a capacitive element area, the method comprising the steps of forming a field oxide film in the capacitive element area on a main surface of the semiconductor substrate, forming a first insulating film on the main surface, forming a first conductive layer over the semiconductor substrate with the first insulating film interposed therebetween in the memory cell area and the capacitive element area, forming a second insulating film on the first conductive layer, patterning the second insulating film, the first conductive layer, and the first insulating film to a predetermined pattern, and etching the semiconductor substrate using the second insulating film as a mask to form a first trench in the memory cell area, and to form the lower electrode on the field oxide film and form a second trench in the field oxide film in the capacitive element area, embedding a third insulating film in the first and second trenches, removing the third insulating film until a surface of the second insulating film is exposed, removing the second insulating film, and forming a fourth insulating film on an exposed surface of the first conductive layer, and forming a second conductive layer on the fourth insulating film.

According to the present invention, the lower electrode of the capacitive element is formed on the field oxide film in self-alignment with trenches. With this arrangement, the lower electrode and the floating gate electrodes in the memory cell area can be formed simultaneously in one process unlike the conventional structure in which the lower electrode is formed on the trench-embedded insulators for device isolation. Therefore, the number of fabrication steps can be reduced. Since the lower electrode is not formed on the trench-embedded insulators for device isolation, the width of the trenches for device isolation can be reduced, allowing the cell density to be increased and also allowing chip area to be reduced.

The above and other objects, features, and advantages of the present invention will become apparent from the following description with reference to the accompanying drawings which illustrate examples of the present invention.

BRIEF DESCRIPTION OF THE DRAWINGS

FIGS. 5A, 5B through 19A, 19B are cross-sectional views illustrative of a process of manufacturing the nonvolatile semiconductor memory device shown in FIGS. 2A and 2B.

DETAILED DESCRIPTION OF THE INVENTION

Figure 2A:
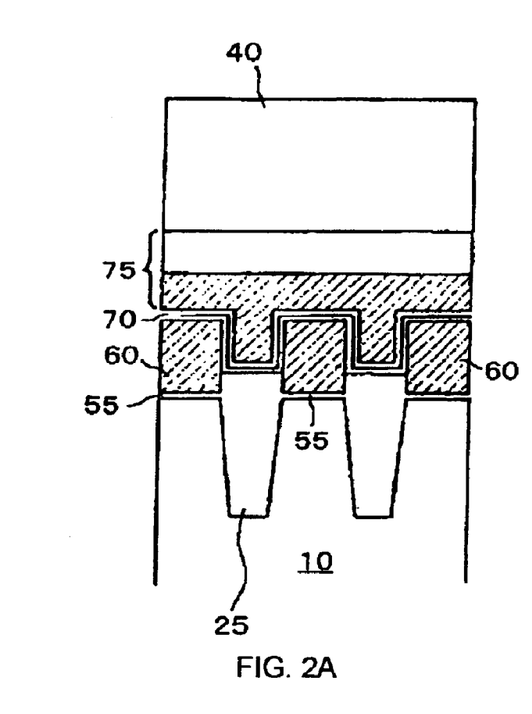
FIGS. 2A and 2B are cross-sectional views of a nonvolatile semiconductor memory device according to a preferred embodiment of the present invention.
Figure 2B:
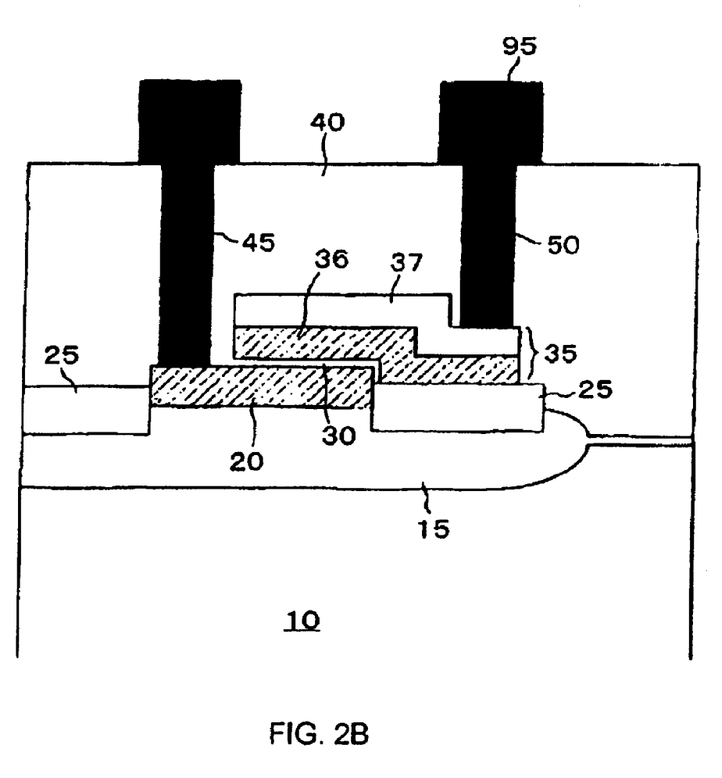
Figure 3:
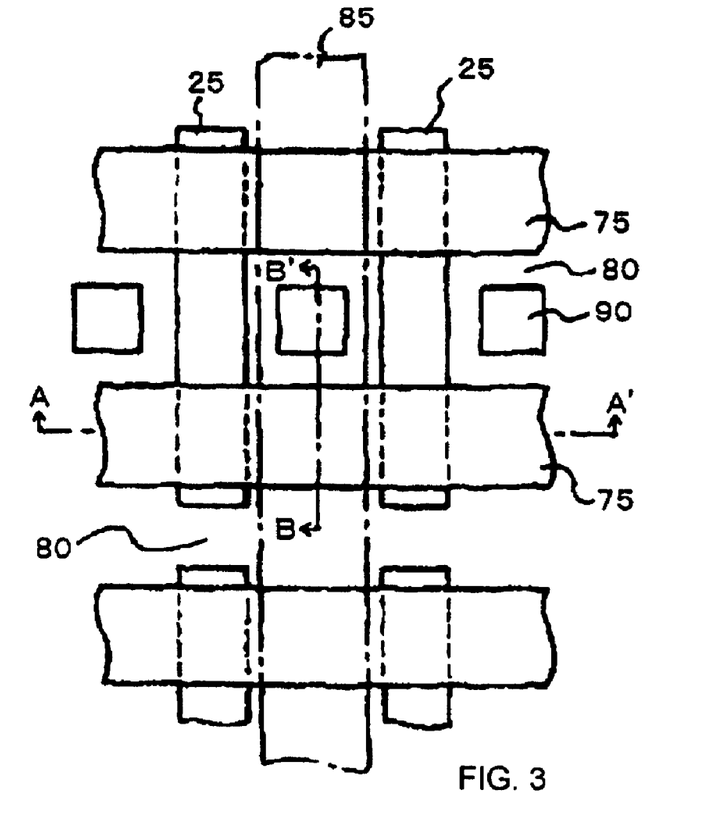
FIG. 3 is a fragmentary plan view of a memory cell of the nonvolatile semiconductor memory device shown in FIGS. 2A and 2B.
Figure 4:
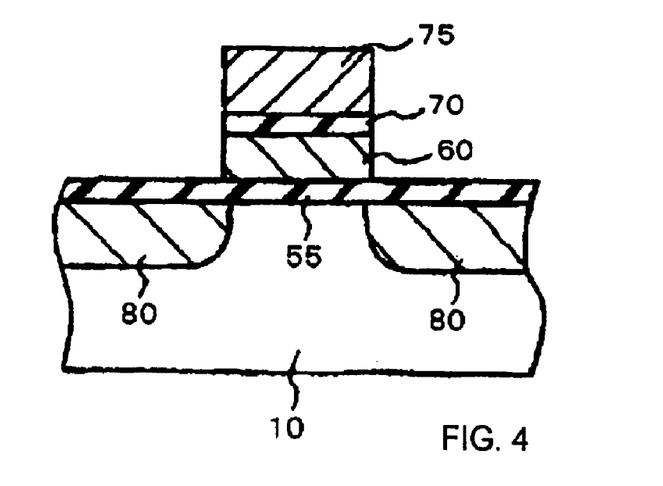
FIG. 4 is a cross-sectional view taken along line B–B' of FIG. 3.

FIGS. 2A and 2B show in cross section an arrangement of a nonvolatile semiconductor memory device according to a preferred embodiment of the present invention. FIG. 2A shows a memory cell area of the nonvolatile semiconductor memory device and FIG. 2B shows an capacitive element area where a capacitive element of a charge pump circuit of the nonvolatile semiconductor memory device is formed. Specifically, FIG. 2A shows a cross section along a plane including a channel region of the memory cell area, the plane being perpendicular to a straight line interconnecting a source region and a drain region. While the capacitive element area and the memory cell area are plotted separately from each other, the capacitive element area and the memory cell area are disposed in one nonvolatile semiconductor memory device. FIG. 3 shows in fragmentary plan the memory cell area. The memory cell area shown in FIG. 2A is taken along line A–A' of FIG. 3. FIG. 4 shows a cross section of the memory cell area taken along line B–B' of FIG. 3.

The semiconductor device has a capacitive element for use in a charge pump circuit. As shown in FIG. 2B, the capacitive element area has lower electrode 20 of the capacitive element and is formed on the surface of field oxide film (LOCOS oxide film) 15 disposed on the surface of semiconductor substrate 10 of silicon or the like. Lower electrode 20 is made of polysilicon or the like, and surrounded by trenches defined in a region of field oxide film 15. The trenches are filled with trench-embedded insulators 25. Upper electrode 35 is formed over lower electrode 20 with insulating film 30 interposed therebetween. Upper electrode 35 extends laterally from a region over lower electrode 20 onto trench-embedded insulators 25. Upper electrode 35 is of a double-layer structure including polysilicon layer 36 of the same material as lower electrode 20 and silicide layer 37 disposed on polysilicon layer 36. Interlayer insulating film 40 is disposed in covering relation to the layers and electrodes described above. Contact plugs 45, 50 extend through interlayer insulating film 40 and electrically connect lower electrode 20 and upper electrode 35 to aluminum interconnections 95. Insulating film 30 is connected to interlayer insulating film 40 and also trench-embedded insulators 25, thus reliably electrically insulating lower electrode 20 and upper electrode 35. Furthermore, insulating film 30 functions as a capacitive film between lower electrode 20 and upper electrode 35, i.e., a capacitive film of the capacitive element.

In the illustrated embodiment, the upper surface of trench-embedded insulators 25 disposed in field oxide film 15 is positionally lower than the upper surface of lower electrode 20 (in the direction toward semiconductor substrate 10). The upper surface of lower electrode 20 and the lower surface of upper electrode 35, and a side of lower electrode 20 and a side of upper electrode 35 confront each other, providing a capacitor of the capacitive element which is of a substantially inverted L-shaped cross section. The thickness of lower electrode 20 is larger than the thickness of trench-embedded insulators 25 disposed in field oxide film 15. In the capacitive element area, the trenches defined in field oxide film 15 are produced in self-alignment with lower electrode 20.

In the memory cell area shown in FIG. 2A, trenches are defined directly in semiconductor substrate 10 and filled with respective trench-embedded insulators 25. The trenches serve to isolate elements between adjacent memory cells. A region between the adjacent trenches on the surface of the semiconductor substrate serves as a channel region. A plurality of floating gate electrodes 60 made of polysilicon or the like are disposed over the channel region with gate insulating film 55 interposed therebetween. The trenches are formed in self-alignment with floating gate electrodes 60. The trenches and floating gate electrodes 60 are formed simultaneously in the same process as the trenches and lower electrode 20 in the capacitive element area. Control gate electrode 75 is formed over floating gate electrodes 60 and trench-embedded insulators 25 disposed therebetween with an insulating film 70 interposed therebetween. Control gate electrode 75 is formed in the same process as upper electrode 35 of the capacitive element area, and is of a double-layer structure including polysilicon layer 36 and silicide layer 37 similar to upper electrode 37. Interlayer insulating film 40 is formed in covering relation to the various layers including control gate electrode 75. Interlayer insulating film 40 in the memory cell area is integrally formed with interlayer insulating film 40 in the capacitive element area.

In the memory cell area, as shown in FIGS. 3 and 4, source and drain diffused regions 80 are formed in respective regions on the opposite sides of floating gate region 60, i.e., on the opposite sides of a channel region in semiconductor substrate 10, in a cross section perpendicular to the direction shown in FIGS. 2A and 2B. Contact holes 90 (not shown in FIG. 4) are formed in interlayer insulating film 40, connecting aluminum interconnections 85 extending in the same direction as the longitudinal direction of the trenches and source and drain diffused regions 80.

Floating gate electrode 60 is formed in self-alignment with control gate electrode 70 at the ends of source and drain diffused regions 80, and is formed self-alignment by the trenches at the side ends of the channel region between source and drain diffused regions 80.

With the nonvolatile semiconductor memory device according to the present embodiment, since lower electrode 20 is formed in self-alignment with the trenches on field oxide film 15, lower electrode 20 and floating gate electrodes 20 can be formed simultaneously in one process unlike the conventional structure in which the lower electrode is formed on the trench-embedded insulators for device isolation. Therefore, the number of steps of the fabrication process can be reduced. Since the lower electrode is not formed on the trench-embedded insulators for device isolation, the width of the trenches for device isolation can be reduced, allowing the cell density to be increased and also allowing chip area to be reduced.

Field oxide film (LOCOS oxide film) 15 in the present embodiment will be described below.

Generally, a nonvolatile semiconductor memory device comprises not only a memory cell array made up of a matrix of memory cells, but also various peripheral circuits including a precharging circuit for precharging bit lines and word lines, an address decoder for decoding addresses, a buffer circuit for holding or amplifying input and output data, a control circuit for controlling operation timings, and a charge pump circuit for generating voltages for writing and erasing data. Since the peripheral circuits handle higher voltages and greater currents than the memory cell area or are geometrically positionally related to input and output terminals, the element density in the peripheral circuits is often smaller than the element density in the memory cell area. Therefore, the elements in the peripheral circuits are isolated by a field oxide film, rather than trenches. According to the present invention, the capacitive element of the charge pump circuit is formed on the field oxide film which has heretofore been used only for device isolation in the peripheral circuits, so that the capacitive element having a high withstand voltage and highly accurate dimensions can be formed while preventing the chip area from being increased. The field oxide film makes it possible to use a relatively large area for the lower electrode. Consequently, it is not necessary to divide the lower electrode, so that the circuit arrangement can be simplified, resulting in a reduction in the chip area.

A process of fabricating the nonvolatile semiconductor memory device shown in FIG. 2A and will be described below. FIGS. 5A and 5B through 19A, 19B are cross-sectional views illustrative of a process of manufacturing the nonvolatile semiconductor memory device shown in FIGS. 2A and 2B. FIGS. 5A through 19A illustrate structures corresponding to the memory cell area of the nonvolatile semiconductor memory device, each showing a cross section along a plane including a channel region of the memory cell area, the plane being perpendicular to a straight line interconnecting a source region and a drain region, while FIGS. 5B through 19B illustrate structures corresponding to the capacitive element area where the capacitive element of the charge pump circuit is to be formed in the nonvolatile semiconductor memory device. While the memory cell area and the capacitive element area are shown separately from each other, the fabrication process in the memory cell area and the fabrication process in the capacitive element area progress simultaneously with each other.

Figure 5A:
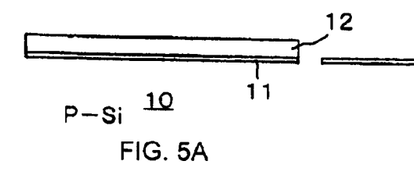
Figure 5B:
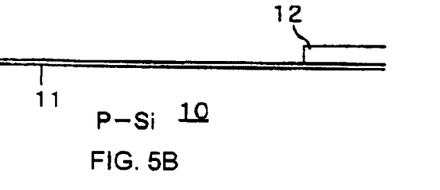
Figure 6A:
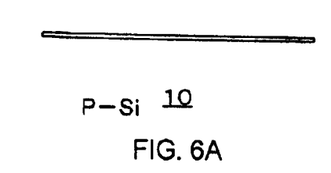
Figure 6B:
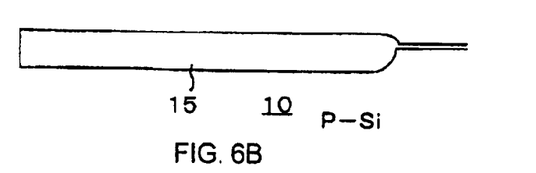
Figures 7A, 7B:
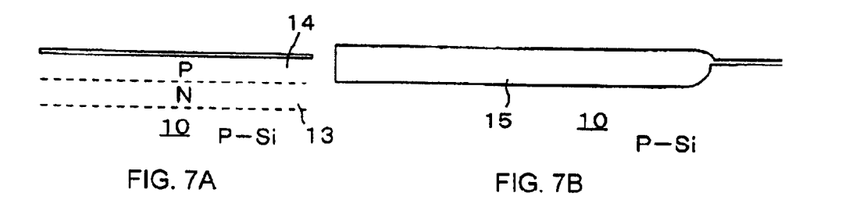

First, silicon nitride film 12 is formed on the entire surface of thin natural oxide film 11, which has a thickness of about 10 nm, for example, on the surface of semiconductor substrate 10 of P-type silicon. Then, as shown in FIGS. 5A and 5B, silicon nitride film 12 is removed from an area where field oxide film 15 of a peripheral circuit is to be formed, by way of photolithography. Then, field oxide film 15 is formed on the area of the surface of semiconductor substrate 10 where silicon nitride film 12 has been removed, by a field oxidization process, after which all silicon nitride film 12 is removed, as shown in FIGS. 6A and 6B. In the memory cell area, ions are introduced into semiconductor substrate 10 by way of ion implantation, producing a double-well structure including deep N well 13 and P well 14, as shown in FIGS. 7A and 7B. If necessary, ions may also be simultaneously introduced into the peripheral circuit area.

Figure 8A:
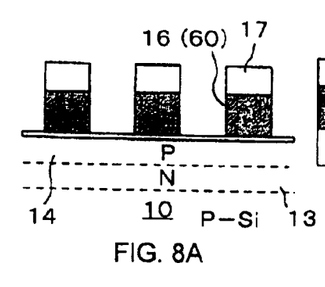
Figure 8B:
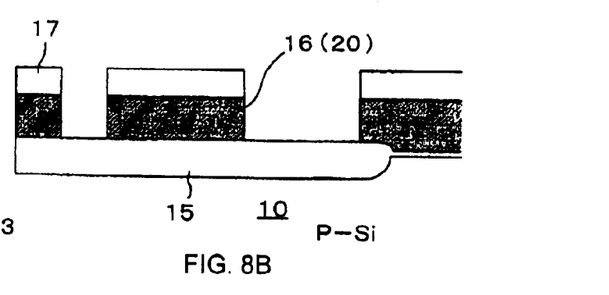

Then, as shown in FIGS. 8A and 8B, polysilicon layer 16 doped with a P-type impurity is formed to a thickness of, for example, about 250 nm on the entire surface, and then silicon nitride layer 17 is formed to a thickness of, for example, about 160 nm on polysilicon layer 16. Silicon nitride layer 17 is patterned to a shape of floating gate electrodes 60 in the memory cell area, and to a shape of lower electrode 20 in the capacitive element area. Thereafter, silicon nitride layer 17 is etched to pattern polysilicon layer 16 to the shapes of floating gate electrodes 60 and lower electrode 20.

Figure 9A:
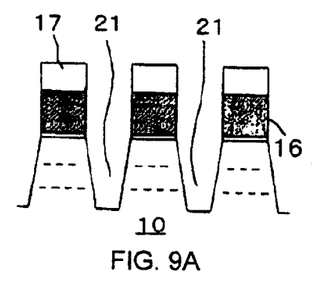
Figure 9B:
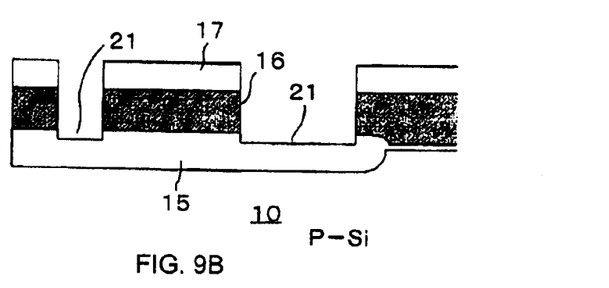

The assembly is continuously etched to form trenches 21 in self-alignment with floating gate electrodes 60 and lower electrode 20, as shown in FIGS. 9A and 9B. At this time, floating gate electrodes 60 are not independent in respective memory cells, but are of a shape where only the areas of trench-embedded insulators (trenches) 25 in FIG. 3 are removed. In the capacitive element area, similarly, polysilicon layer 16 remains unremoved in the area corresponding to lower electrode 20 and areas other than trenches 21 surrounding lower electrode 20. At this time, since silicon semiconductor substrate 10 is etched in the memory cell area and field oxide film 15 is etched in the capacitive element area, deeper trenches 21 are formed in the memory cell area and shallower trenches 21 are formed in the capacitive element area due to the different etching rates. Specifically, trenches 21 in the memory cell area are so deep that they isolate even deep N well 13 and reach the main body of P-type semiconductor substrate 10, but trenches 21 in the capacitive element area are so shallow that they only remove a thin surface layer of field oxide film 15.

Figure 10A:
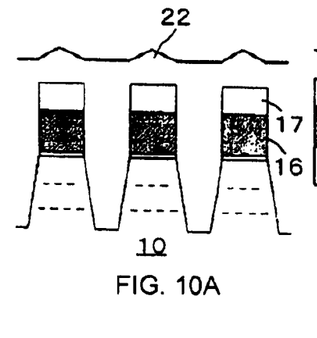
Figure 10B:
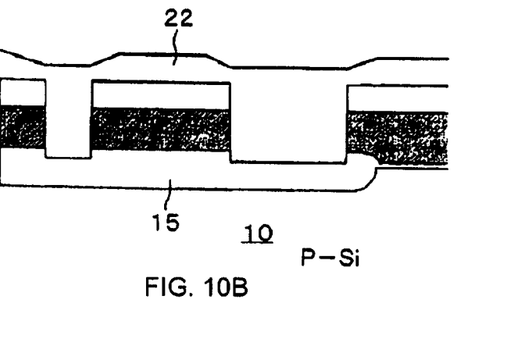
Figure 11A:
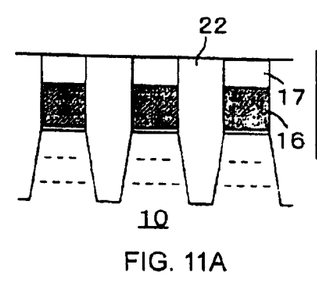
Figure 11B:
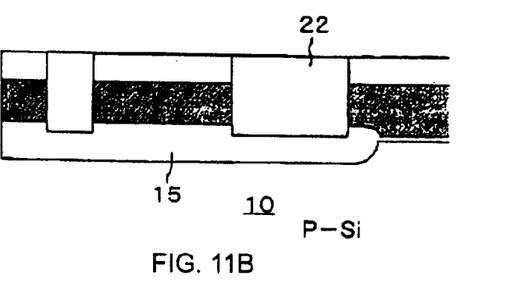
Figure 12A:
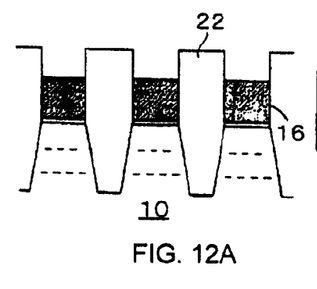
Figure 12B:
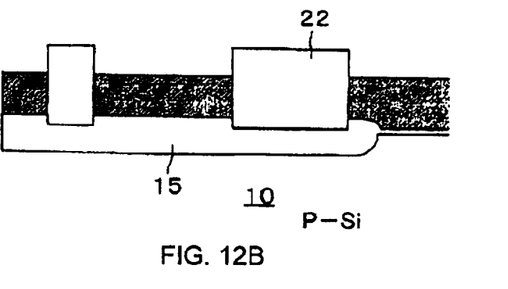

Then, as shown in FIGS. 10A and 10B, oxide silicon 22 is embedded in the etched areas, which correspond to trenches 21, by HDP (High-Density Plasma) CVD (Chemical Vapor Deposition). Since oxide silicon 22 is first deposited on the entire surface including the surface of silicon nitride layer 17, deposited oxide silicon 22 is subsequently polished away until the surface of silicon nitride layer 17 is exposed, by way of CMP (Chemical Mechanical Polishing), as shown in FIGS. 11A and 11B. Thereafter, as shown in FIGS. 12A and 12B, silicon nitride layer 17 is etched away by, for example, hot phosphoric acid. At this time, a thin oxide film may be formed on the surface of polysilicon layer 16 in order to protect polysilicon layer 16 (i.e., floating gate electrodes 60 and lower electrode 20).

Figure 13A:
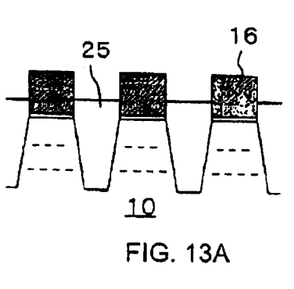
Figure 13B:
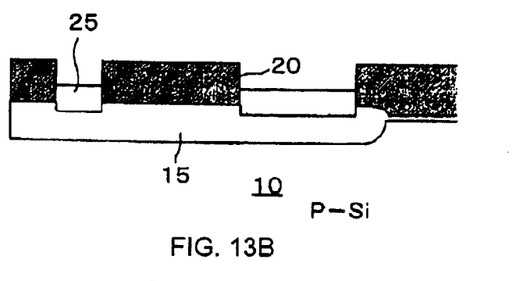

Then, using this polysilicon layer 16 as a mask, silicon oxide layer 22 is etched and converted to trench-embedded insulators 25, as shown in FIGS. 13A and 13B.

Figures 14A, 14B:
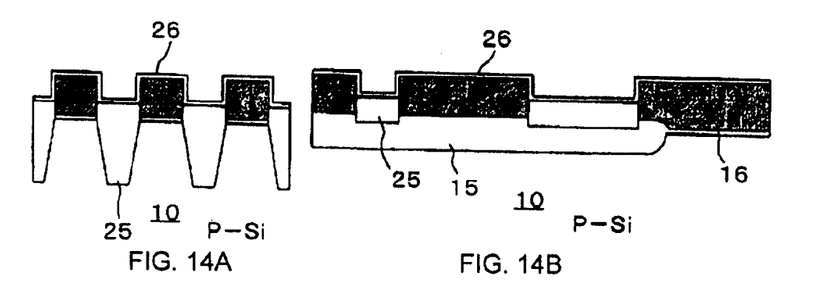
Figures 15A, 15B:
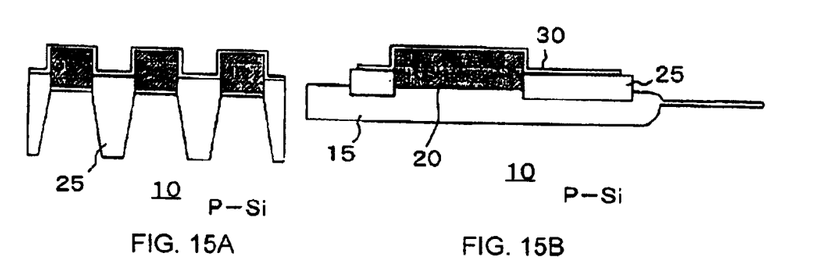

Thereafter, ONO insulating film 26, which is of a multiple-layer structure of layers of SiO2, SiN, and SiO2, is formed on the entire surface, as shown in FIGS. 14A and 14B. ONO insulating film 26 will serve as insulating film 70 between floating gate electrodes 60 and control gate electrode 75 in the memory cell area, and as insulating film (capacitive film) 30 between lower electrode 20 and upper electrode 35 in the capacitive element area. ONO insulating film 26 is then patterned to a desired shape, as shown in FIGS. 15A and 15B.

Figures 16A, 16B:
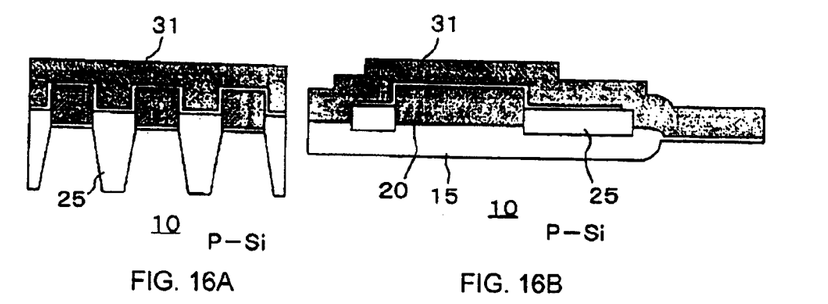
Figures 17A, 17B:
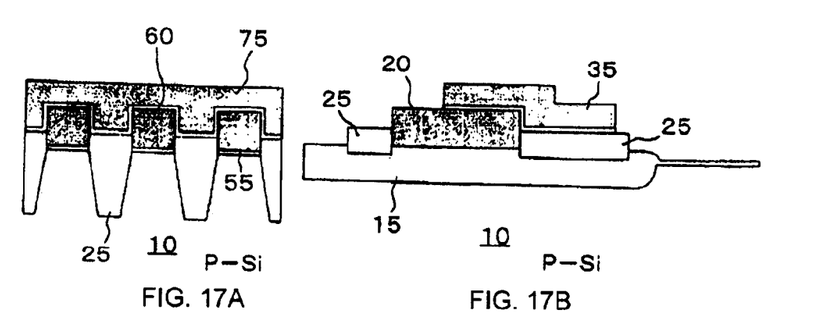

Next, polysilicon layer 31 is then formed on the entire surface, as shown in FIGS. 16A and 16B, and then patterned to shapes of control gate electrode 75 and upper electrode 35, as shown in FIGS. 17A and 17B. At this time, other circuit portions than the capacitive element in the peripheral circuit are also patterned. In the memory cell area, floating gate electrodes 60 (polysilicon layer 16) are etched away in self-alignment with patterned control gate electrode 75, isolating floating gate electrodes 60 in respective memory cell. As a result, polysilicon layer 36 as a first layer of control gate electrode 75 and upper electrode 35 is formed.

Thereafter, in the memory cell area, an N-type impurity is introduced into the memory cell area by way of ion implantation, using control gate electrode 75 (and floating gate electrodes 60 therebeneath) as a mask, producing source and drain diffused regions 80 (see FIGS. 3 and 4).

Figure 18A:
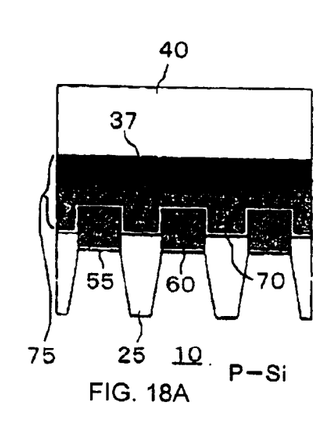
Figure 18B:
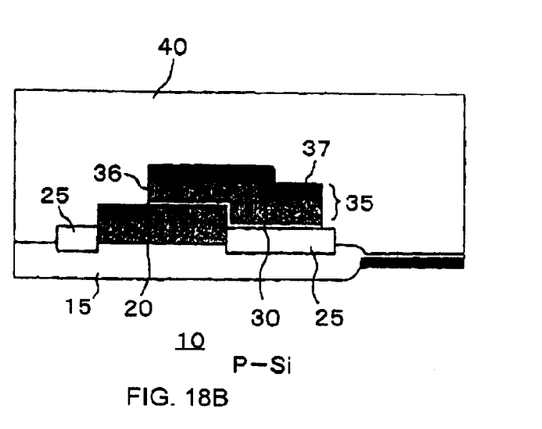
Figure 19A:
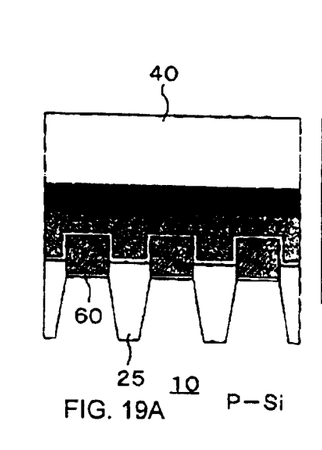
Figure 19B:
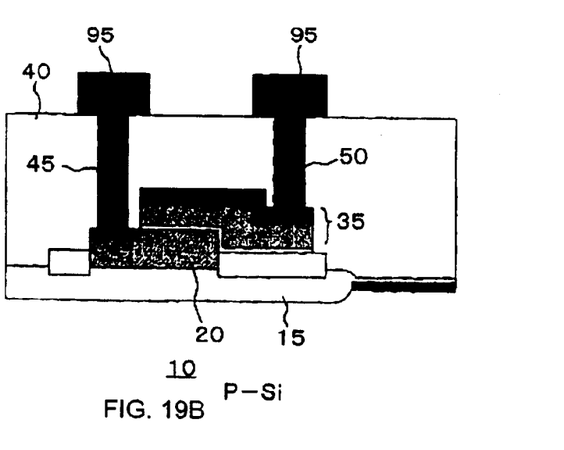

Then, as shown in FIGS. 18A and 18B, an upper portion of polysilicon layer 36 as the first layer of control gate electrode 75 and upper electrode 35 is turned into silicide layer 37. Silicide layer 37 is made of CoSi, for example, and the portion of the polysilicon layer of lower electrode 20 which is covered with upper electrode 35 is also silicidized. Thereafter, interlayer insulating film 40 of BPSG (borophosphate silicate glass) is formed on the entire surface by way of thermal CVD using TEOS (tetraethoxy orthosilicate: $Si(OC_2H_5)_4$)+ozone ($O_3$). Contact holes reaching lower electrode 20 and upper electrode 35, respectively, are formed in interlayer insulating film 40, and are then filled with tungsten, thereby producing contact plugs 45, 50. Thereafter, as shown in FIGS. 19A and 19B, aluminum interconnections 95 connecting with contact plugs 45, 50 are formed on interlayer insulating film 40, thereby completing the nonvolatile semiconductor memory device shown in FIGS. 2A and 2B.

As can be seen from the above description, the above fabrication process is the same as the fabrication process disclosed in JP, 7-022195, B with respect to the fabrication of the memory cell area. According to the present invention, the fabrication process for manufacturing the capacitive element area is arranged such that the capacitive element can be fabricated concurrently with the fabrication process for manufacturing the memory cell area.

Figure 20A:
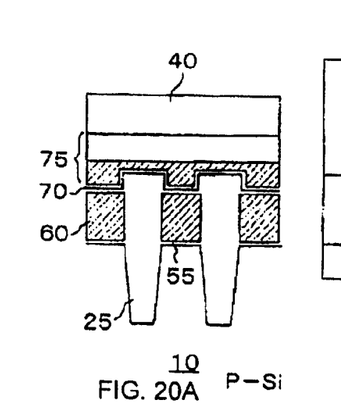
FIGS. 20A and 20B are cross-sectional views of a nonvolatile semiconductor memory device according to another embodiment of the present invention.
Figure 20B:
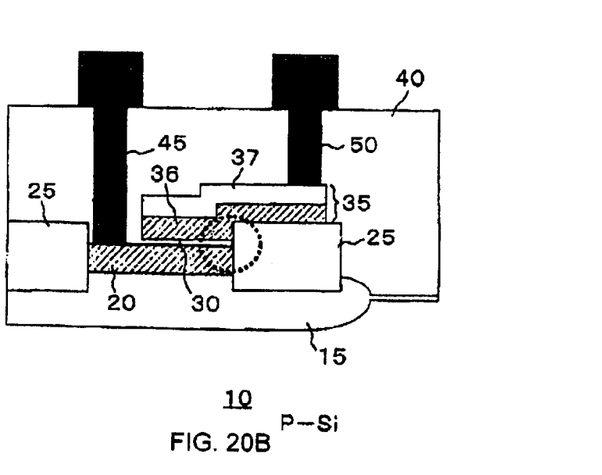

A nonvolatile semiconductor memory device according to another embodiment of the present invention will be described below with reference to FIGS. 20A and 20B. FIG. 20A shows a memory cell area of the nonvolatile semiconductor memory device. Specifically, FIG. 20A shows a cross section along a plane including a channel region of the memory cell area, the plane being perpendicular to a straight line interconnecting a source region and a drain region. FIG. 20B shows an area where a capacitive element of a charge pump circuit of the nonvolatile semiconductor memory device is formed.

The nonvolatile semiconductor memory device shown in FIGS. 20A and 20B is of a structure similar to the nonvolatile semiconductor memory device shown in FIGS. 2A and 2B, and is manufactured by a fabrication process similar to the fabrication process described above. However, the nonvolatile semiconductor memory device shown in FIGS. 20A and 20B is different from the nonvolatile semiconductor memory device shown in FIGS. 2A and 2B in that the thickness of trench-embedded insulators 25 is greater than the thickness of trench-embedded insulators 25 shown in FIGS. 2A and 2B, and the upper surface of trench-embedded insulators 25 is position higher than the upper surface of lower electrode 20 in the capacitive element area. Since thickness of trench-embedded insulators 25 is increased, trench-embedded insulators 25 are thick in regions where the trenches are formed in the memory cell area, and convex with respect to control gate electrode 75.

In the nonvolatile semiconductor memory device shown in FIGS. 20A and 20B, the capacitive element area is formed by only the upper surface of lower electrode 20 and the lower surface of upper electrode 35. In the nonvolatile semiconductor memory device shown in FIGS. 2A and 2B, since the capacitive film has an inverted L-shaped cross section, an electric field concentration tends to occur at the corner of the inverted L-shaped cross section (an edge of lower electrode 20), possibly causing a reduction in the dielectric strength. However, since the nonvolatile semiconductor memory device shown in FIGS. 20A and 20B does not have such an edge as indicated by the broken-line circle, no electric field concentration occurs on the capacitive insulating film, thus increasing the reliability of the capacitive element.

While preferred embodiments of the present invention have been described in specific terms, such description is for illustrative purposes only, and it is to be understood that changes and variations may be made without departing from the spirit or scope of the following claims.

What is claimed is:

1. A semiconductor device comprising:
   a semiconductor substrate;
   a device isolation film disposed on said semiconductor substrate;
   a lower electrode disposed on said device isolation film;
   trenches formed in said device isolation film in surrounding relation to said lower electrode and having a bottom portion that is lower than a bottom portion of said lower electrode;
   trench-embedded insulators embedded in said trenches;
   an insulating film disposed on said lower electrode; and
   an upper electrode disposed over said lower electrode with said insulating film interposed therebetween;
   wherein said lower electrode, said insulating film, and said upper electrode jointly make up a capacitive element.

2. A semiconductor device comprising:
   a semiconductor substrate;
   a device isolation film disposed on said semiconductor substrate;
   a lower electrode disposed on said device isolation film;
   a trench formed in said device isolation film in surrounding relation to said lower electrode and having a bottom portion that is lower than a bottom portion of said lower electrode;
   a trench-embedded insulator embedded in said trench;
   an insulating film disposed on said lower electrode; and
   an upper electrode disposed over said lower electrode with said insulating film interposed therebetween;
   wherein said lower electrode, said insulating film, and said upper electrode jointly make up a capacitive element, and
   wherein said trench-embedded insulator has an upper surface positioned higher than an upper surface of said lower electrode.

3. The semiconductor device comprising:
   a semiconductor substrate;
   a device isolation film disposed on said semiconductor substrate;
   a lower electrode disposed on said device isolation film;
   trenches formed in said device isolation film in surrounding relation to said lower electrode and having a bottom portion that is lower than a bottom portion of said lower electrode;
   trench-embedded insulators embedded in said trenches;
   an insulating film disposed on said lower electrode; and
   an upper electrode disposed over said lower electrode with said insulating film interposed therebetween;
   wherein said lower electrode, said insulating film, and said upper electrode jointly make up a capacitive element, and
   wherein said capacitive element comprises a capacitor of a charge pump circuit.

4. The semiconductor device according to claim 1, wherein said semiconductor device is a nonvolatile memory device having a plurality of memory cells each comprising a channel region, a floating gate electrode disposed over said channel region with a gate insulating film interposed therebetween, and a control gate electrode disposed over said floating gate electrode with an insulating film interposed therebetween, and wherein elements of each of the memory cells are isolated by said trench-embedded insulators.

5. A semiconductor device comprising:
   a semiconductor substrate;
   a device isolation film disposed on said semiconductor substrate;
   a lower electrode disposed on said device isolation film;
   a trench formed in said device isolation film in surrounding relation to said lower electrode and having a bottom portion that is lower than a bottom portion of said lower electrode;
   a trench-embedded insulator embedded in said trench;
   an insulating film disposed on said lower electrode; and
   an upper electrode disposed over said lower electrode with said insulating film interposed therebetween;
   wherein said lower electrode, said insulating film, and said upper electrode jointly make up a capacitive element,
   wherein said semiconductor device is a nonvolatile memory device having a plurality of memory cells each comprising a channel region, a floating gate electrode disposed over said channel region with a gate insulating film interposed therebetween, and a control gate electrode disposed over said floating gate electrode with an insulating film interposed therebetween, and wherein elements of each of the memory cells are isolated by said trench-embedded insulator, and
   wherein said trench-embedded insulator has an upper surface positioned higher than an upper surface of said lower electrode.

6. The semiconductor device comprising:

a semiconductor substrate;

a device isolation film disposed on said semiconductor substrate;

a lower electrode disposed on said device isolation film;

a trench formed in said device isolation film in surrounding relation to said lower electrode and having a bottom portion that is lower than a bottom portion of said lower electrode;

a trench-embedded insulator embedded in said trench;

an insulating film disposed on said lower electrode; and an upper electrode disposed over said lower electrode with said insulating film interposed therebetween;

wherein said lower electrode, said insulating film, and said upper electrode jointly make up a capacitive element, wherein said semiconductor device is a nonvolatile memory device having a plurality of memory cells each comprising a channel region, a floating gate electrode disposed over said channel region with a gate insulating film interposed therebetween, and a control gate electrode disposed over said floating gate electrode with an insulating film interposed therebetween, and wherein elements of each of the memory cells are isolated by said trench-embedded insulator, wherein said trench-embedded insulator has an upper surface positioned higher than an upper surface of said lower electrode, and wherein said capacitive element comprises a capacitor of a charge pump circuit.

* * * * *